US010205026B2

(12) United States Patent
Tian

(10) Patent No.: US 10,205,026 B2
(45) Date of Patent: Feb. 12, 2019

(54) THIN FILM TRANSISTOR HAVING A COMPOSITE METAL GATE LAYER

(71) Applicant: BOE TECHNOLOGY GROUP CO., LTD., Beijing (CN)

(72) Inventor: Hui Tian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/533,336

(22) PCT Filed: May 9, 2016

(86) PCT No.: PCT/CN2016/081415
§ 371 (c)(1),
(2) Date: Jun. 5, 2017

(87) PCT Pub. No.: WO2017/161645
PCT Pub. Date: Sep. 28, 2017

(65) Prior Publication Data
US 2018/0053858 A1   Feb. 22, 2018

(30) Foreign Application Priority Data

Mar. 22, 2016   (CN) .......................... 2016 1 0166425

(51) Int. Cl.
*H01L 29/78*   (2006.01)
*H01L 29/49*   (2006.01)
(Continued)

(52) U.S. Cl.
CPC ........ *H01L 29/78603* (2013.01); *H01L 21/28* (2013.01); *H01L 21/283* (2013.01);
(Continued)

(58) Field of Classification Search
CPC ............. H01L 29/78603; H01L 29/423; H01L 29/4908; H01L 29/51; H01L 29/66477;
(Continued)

(56) References Cited

U.S. PATENT DOCUMENTS 6,537,843 B2 *   3/2003   Lyu ........................ H01L 27/12
257/213
6,812,490 B2 *  11/2004   Takehashi ......... H01L 29/42384
257/49

(Continued)

FOREIGN PATENT DOCUMENTS

CN       H08116066 A    5/1996
CN       101425538 A    5/2009
(Continued)

OTHER PUBLICATIONS

International Search Report and Written Opinion, for PCT Patent Application No. PCT/CN2016/081415, dated Dec. 30, 2016, 18 pages.

(Continued)

*Primary Examiner* — Ida M Soward
(74) *Attorney, Agent, or Firm* — Kinney & Lange, P.A.

(57) ABSTRACT

A thin film transistor includes a substrate, and, a source electrode, a drain electrode, a gate, a gate insulation layer and an active layer disposed on the substrate; the gate insulation layer is located between the gate and the active layer, and the source electrode and the drain electrode are connected to the active layer, respectively; and the gate is a composite metal layer including at least one first metal layer which contains doped ions therein and which is close to the gate insulation layer, and at least one second metal layer which is apart from the gate insulation layer and is not doped with ions.

18 Claims, 8 Drawing Sheets

(51) Int. Cl.
   *H01L 29/51* (2006.01)
   *H01L 29/66* (2006.01)
   *H01L 29/786* (2006.01)
   *H01L 21/283* (2006.01)
   *H01L 29/40* (2006.01)
   *H01L 21/28* (2006.01)
   *H01L 29/423* (2006.01)

(52) U.S. Cl.
   CPC ............ *H01L 29/40* (2013.01); *H01L 29/423* (2013.01); *H01L 29/4908* (2013.01); *H01L 29/51* (2013.01); *H01L 29/66477* (2013.01); *H01L 29/66613* (2013.01); *H01L 29/66742* (2013.01); *H01L 29/78* (2013.01); *H01L 29/786* (2013.01)

(58) Field of Classification Search
   CPC ......... H01L 29/66613; H01L 29/66742; H01L 29/78
   See application file for complete search history.

(56) References Cited

U.S. PATENT DOCUMENTS

| | | | | |
|---|---|---|---|---|
| 7,535,024 | B2* | 5/2009 | Oue | H01L 29/42384 257/347 |
| 7,642,143 | B2* | 1/2010 | Kim | H01L 29/4908 257/E21.205 |
| 7,659,189 | B2* | 2/2010 | Lin | H01L 21/28097 438/585 |
| 7,785,958 | B2* | 8/2010 | Doczy | H01L 21/82384 257/E27.064 |
| 8,013,341 | B2* | 9/2011 | Jun | H01L 27/3246 257/40 |
| 8,178,881 | B2* | 5/2012 | Oh | H01L 27/124 257/59 |
| 8,308,963 | B2* | 11/2012 | Chae | C23F 1/18 216/104 |
| 9,105,623 | B2* | 8/2015 | Chiang | H01L 27/088 |
| 9,127,368 | B2* | 9/2015 | Kim | C23F 1/18 |
| 9,646,891 | B2* | 5/2017 | Yang | H01L 27/092 |
| 9,741,827 | B2* | 8/2017 | Choung | H01L 27/124 |
| 2002/0179908 | A1 | 12/2002 | Arao | |
| 2004/0017365 | A1* | 1/2004 | Hatano | G09G 3/3688 345/204 |
| 2006/0001789 | A1* | 1/2006 | Ahn | G02F 1/133345 349/42 |
| 2008/0135837 | A1* | 6/2008 | Kim | H01L 29/4908 257/40 |
| 2009/0091699 | A1* | 4/2009 | Lee | G02F 1/13458 349/139 |
| 2009/0163022 | A1* | 6/2009 | Lee | H01L 27/12 438/648 |
| 2013/0299817 | A1* | 11/2013 | Park | H01L 29/45 257/43 |

FOREIGN PATENT DOCUMENTS

| | | |
|---|---|---|
| CN | 101976679 A | 2/2011 |
| CN | 102064188 A | 5/2011 |
| CN | 102612737 A | 7/2012 |
| CN | 205428944 U | 8/2016 |

OTHER PUBLICATIONS

First Chinese Office Action dated Jan. 29, 2018, for corresponding Chinese Application No. 201610166425.9.

* cited by examiner

THIN FILM TRANSISTOR HAVING A COMPOSITE METAL GATE LAYER

CROSS-REFERENCE TO RELATED APPLICATION

This application is a Section 371 National Stage Application of International Application No. PCT/CN2016/081415, filed on May 9, 2016, entitled "THIN FILM TRANSISTOR AND METHOD OF MANUFACTURING THE SAME, AND DISPLAY DEVICE", which has not yet published, and which claims priority to Chinese Application No. 201610166425.9, filed on Mar. 22, 2016, incorporated herein by reference in their entirety.

BACKGROUND

Technical Field

The present disclosure relates to the field of display and semiconductor device technologies, and particularly to a thin film transistor and a method of manufacturing the same, and a display device.

Description of the Related Art

For a thin film transistor, mobility of carriers in a channel region of an active layer will affect electric conductivity and working frequency of the transistor device, and improvement in mobility of the carriers will improve performances of the device. In prior arts, there are mainly two methods of improving mobility of carriers with the use of stress. A first method is to provide a substrate heterojunction structure below the active layer or to provide heterojunction source electrode-drain structures at either side of the channel region of the active layer, in order to introduce stress to improve mobility of carriers. However, the substrate heterojunction structure or the heterojunction source electrode-drain structures are of semiconductor structure, which will bring impurity defects and lattice defects to the channel region. Moreover, the manufacturing process for this method is complicated and restricts reduction of size. A second method is to cover the device with a high stress thin film, so that deformation of the thin film itself results in deformation of the device, to produce a stress in the active layer, so as to change mobility property of carriers of the device. Similarly, the manufacturing process for this method is also complicated and restricts reduction of size.

SUMMARY

In one aspect, the present disclosure provides a thin film transistor comprising: a substrate, and, a source electrode, a drain electrode, a gate, a gate insulation layer and an active layer disposed on the substrate; wherein, the gate insulation layer is between the gate and the active layer; the source electrode and the drain electrode are connected to the active layer, respectively; and the gate is a composite metal layer comprising at least one first metal layer which contains doped ions therein and which is close to the gate insulation layer, and at least one second metal layer which is apart from the gate insulation layer.

Optionally, the first metal layer which contains doped ions therein is configured to introduce a stress to the active layer.

Optionally, in the first metal layer which contains doped ions therein, the doped ions comprise nitrogen ions.

Optionally, a dosage of the nitrogen ions in the first metal layer is in a range of $1.0e^{12}/cm^2 \sim 1.0e^{13}/cm^2$.

Optionally, a material of the gate insulation layer at least comprises silicon oxide or silicon nitride.

Optionally, materials of the first metal layer and the second metal layer at least comprise one of molybdenum, titanium and aluminum.

Optionally, the composite metal layer comprises one said first metal layer which contains doped ions therein and two said second metal layers; a material of the first metal layer comprises molybdenum or titanium, a material of one said second metal layer which is close to the first metal layer comprises aluminum, and a material of one said second metal layer which is apart from the first metal layer comprises molybdenum or titanium.

Optionally, a stacking sequence of the gate, the active layer and the gate insulation layer on the substrate is an arrangement of the active layer, the gate insulation layer and the gate in this order.

Optionally, the thin film transistor further comprises an interlayer dielectric layer, wherein, the interlayer dielectric layer covers the gate and the gate insulation layer, the source electrode passes through the interlayer dielectric layer and the gate insulation layer to be connected with the active layer, and, the drain electrode passes through the interlayer dielectric layer and the gate insulation layer to be connected with the active layer.

Optionally, a stacking sequence of the gate, the active layer and the gate insulation layer on the substrate is an arrangement of the gate, the gate insulation layer and the active layer in this order.

In another aspect, the present disclosure provides a display device, comprising the abovementioned thin film transistor.

In still another aspect, the present disclosure provides a method of manufacturing a thin film transistor, comprising: steps of forming a gate, a gate insulation layer, an active layer, a source electrode and a drain electrode on a substrate; the gate insulation layer is located between the gate and the active layer; the source electrode and the drain electrode are connected to the active layer, respectively; the step of forming the gate comprises: forming a composite metal layer for formation of the gate; the composite metal layer comprises at least one first metal layer which contains doped ions therein and which is located close to the gate insulation layer, and at least one second metal layer which is located apart from the gate insulation layer.

Optionally, the first metal layer which contains doped ions therein is configured to introduce a stress to the active layer.

Optionally, in this method, the composite metal layer is formed so as to form the gate by using an ion implantation process and a patterning process.

Optionally, the steps of forming the gate, the gate insulation layer, the active layer, the source electrode and the drain electrode on the substrate comprises: forming the active layer on the substrate; forming the gate insulation layer over the active layer and the substrate; forming the composite metal layer, for formation of the gate, on the gate insulation layer and above the active layer by using an ion implantation process and a patterning process; implementing, with the composite metal layer being served as a mask, an ion injection to the active layer through the gate insulation layer, by using an ion implantation process; and forming the source electrode and the drain electrode respectively connected to the active layer.

Optionally, the step of forming the composite metal layer to form the gate on the gate insulation layer and above the active layer by using the ion implantation process and the patterning process, comprises: forming at least one first metal thin film on the gate insulation layer and above the active layer; implementing nitrogen ion injection to the first metal thin film; forming at least one second metal thin film on the first metal thin film into which the nitrogen ions were injected; and etching the first metal thin film and the second metal thin film by using a patterning process, so as to form the gate.

Optionally, when implementing nitrogen ion injection to the first metal thin film, an energy value of the nitrogen ions is in a range of 20 kev~40 kev.

Optionally, the method further comprises: forming an interlayer dielectric layer which covers the gate and the gate insulation layer; and the forming the source electrode and the drain electrode respectively connected to the active layer comprises: forming a first contact hole and a second contact hole which pass through the interlayer dielectric layer and the gate insulation layer, by a patterning process, to expose the active layer; and depositing a source electrode metal layer and a drain electrode metal layer into the first contact hole and the second contact hole, respectively, to form the source electrode and the drain electrode.

DETAILED DESCRIPTION OF THE EMBODIMENTS

Figure 1:
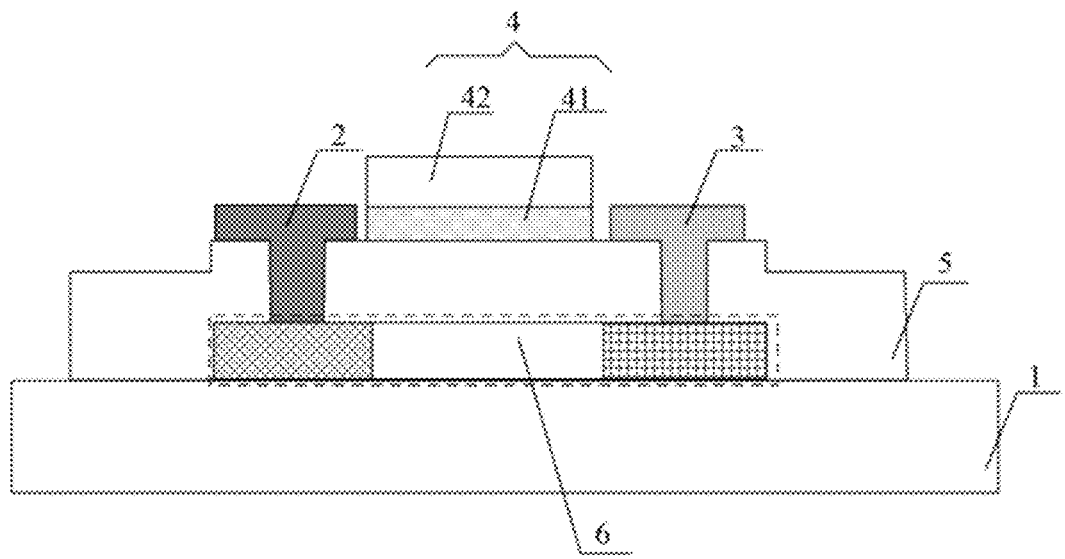
FIG. 1 is a schematic view of a structure of a thin film transistor according to the present disclosure.

In order to provide a more clear understanding of technique solutions of the present disclosure, structure of an active layer in a thin film transistor is firstly described in brief. In the active layer, there are two semiconductor structures formed by injection or implantation of ions, and different injected ions produce different carriers. If the carriers are electrons, the semiconductor structure is named as N-type doped structure. If the carriers are holes, the semiconductor structure is named as P-type doped structure. Two electrodes, which are in ohmic contact with the two semiconductor structures of the active layer, are a source electrode and a drain electrode. Correspondingly, the two semiconductor structures are called as source region and a drain region. Between the source region and the drain electrode region is a channel region. When the thin film transistor operates normally, a suitable bias voltage is applied between across the source electrode and the drain electrode, and a gate voltage is applied to the gate, so that mobility movement of the carriers occurs in the channel region, so as to form a channel current.

In order to improve mobility of carriers in the thin film transistor without increasing process complexity, the present disclosure provides a thin film transistor. The thin film transistor comprises: a substrate, and, a source electrode, a drain electrode, a gate, a gate insulation layer and an active layer disposed on the substrate; the gate insulation layer is located between the gate and the active layer; the source electrode and the drain electrode are connected to the active layer, respectively; and the gate is a composite metal layer comprising at least one first metal layer which contains doped ions therein and which is located close to the gate insulation layer, and at least one second metal layer which is located apart from the gate insulation layer. Specifically, the first metal layer containing doped ions therein is configured to introduce a stress to the active layer.

Specifically, ions doped in the first metal layer can alter atomic arrangement in the first metal layer, so that stress in the first metal layer will change. In this way, the first metal layer will generate contact or diffusion type compressive stress or tensile stress on the gate insulation layer and the active layer located under and contacting the first metal layer. As a result, energy band of the active layer bends and its energy band structure changes, including change of the energy band structure of the channel region in the active layer.

In the thin film transistor according to the present disclosure, the gate is in a structure of a composite metal layer. Specifically, a first metal layer of the composite metal layer located close to the gate insulation layer contains doped ions therein. This can introduce a stress to the active layer, change energy band structure of the channel region in the active layer, and alter effective quality and anisotropic scattering of carriers, and the like, thereby enhancing mobility of the carriers. In addition, a second metal layer of the composite metal layer located away from the gate insulation layer is not doped with ions, so that an effective resistance of the whole gate is ensured. In embodiments of the present disclosure, improvement of the mobility of carriers is achieved by modifying the gate of the thin film transistor. Meanwhile, no additional structure is required to be added, which simplifies the processes in the course of production.

Specifically, there are two following stacking sequences for the gate, the active layer and the gate insulation layer on the substrate. A first stacking sequence of the gate, the active layer and the gate insulation layer on the substrate may be an arrangement of the active layer, the gate insulation layer and the gate in this order. A second stacking sequence of the gate, the active layer and the gate insulation layer on the substrate may be an arrangement of the gate, the gate insulation layer and the active layer in this order.

Much more clear description of the thin film transistor according to the present disclosure will be presented hereinafter by taking the first stacking sequence as an example.

Referring to FIG. 1, the present disclosure provides a thin film transistor, comprising: a substrate 1, and, a source electrode 2, a drain electrode 3, a gate 4, a gate insulation layer 5 and an active layer 6 disposed on the substrate 1; in an example, the gate insulation layer 5 is located between the gate 4 and the active layer 6 (shown by dashed line box); the source electrode 2 and the drain electrode 3 are connected to the active layer 6, respectively; and the gate 4 is a composite metal layer comprising at least one first metal layer 41 which contains doped ions therein and which is located close to the gate insulation layer, and at least one second metal layer 42 which is located apart from the gate insulation layer 5. Specifically, the first metal layer 41 containing doped ions therein is configured to introduce a stress to the active layer 6.

Figure 4:
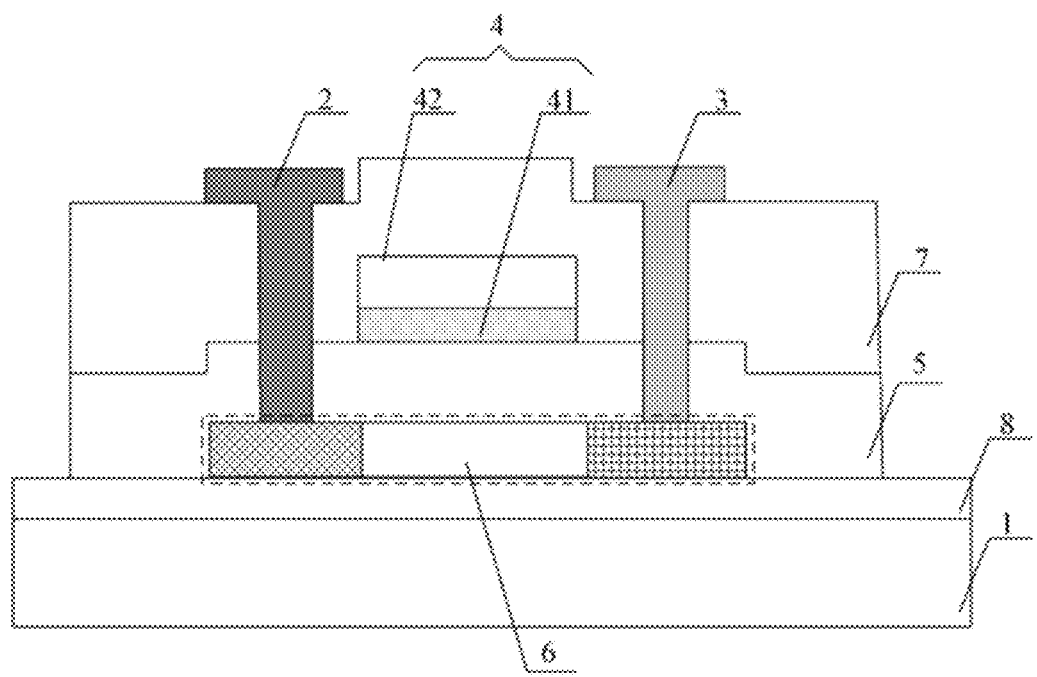
FIG. 4 is a schematic view of a structure of a further thin film transistor according to the present disclosure.

In FIG. 4, the source region and the drain region are presented with different filling styles, and the channel region is formed between the source region and the drain region of the active layer 6.

Specifically, the active layer 6 is located on the substrate 1, the gate insulation layer 5 covers the active layer 6 and the substrate 1, and the gate 4 is located on the active layer 6. In this thin film transistor, the first metal layer 41 containing doped ions therein not only can introduce the stress to the active layer so as to enhance mobility of the carriers, but also effectively prevents other impurities from passing through the gate 4 to diffuse to the gate insulation layer 5. In this way, a leakage current of the transistor device can be reduced and a drift issue of threshold voltage can be alleviated, so that electrical properties of the transistor device are entirely improved.

Specifically, there may be various types of ions doped in the first metal layer, as long as conditions including stable bond energy of the doped ions and no influence on insulation property of the gate insulation layer are satisfied In a specific implementation, optionally, in the first metal layer containing doped ions therein, the doped ions comprise nitrogen ions.

In a specific implementation, intensity or amplitude of the stress that is introduced to the active layer by the first metal layer containing doped ions therein can be controlled by controlling dosage of the ions. The larger the dosage of the ions is, the greater the intensity or amplitude of the introduced stress is. Of course, influence on effective resistance of the gate should be considered as well. Accordingly, the dosage of the doped ions in the first metal layer is set in accordance with practical requirements, ensuring that not only effective resistance of the gate is not influenced but also the object of introduction of the stress is achieved.

In a specific implementation where the first metal layer is doped with nitrogen ions, optionally, dosage of the nitrogen ions is in a range of $1.0e12/cm^2 \sim 1.0e^{13}/cm^2$.

The above range of dosage of the nitrogen ions means that, in the first metal layer, there are $1.0e^{12} \sim 1.0e^{13}$ doped nitrogen ions per square centimeter.

In order to further ensure that effective resistance of the gate is not adversely affected, in a specific implementation, the whole thickness of the at least one first metal layer containing doped ions therein does not go beyond 40% of a total thickness of the gate.

Optionally, a material of the gate insulation layer at least comprises silicon oxide or silicon nitride. As such, nitrogen ions will not affect property of the gate insulation layer made of silicon oxide and/or silicon nitride material.

In a specific implementation, optionally, materials of the first metal layer and the second metal layer at least comprise one of molybdenum, titanium and aluminum.

Figure 2:
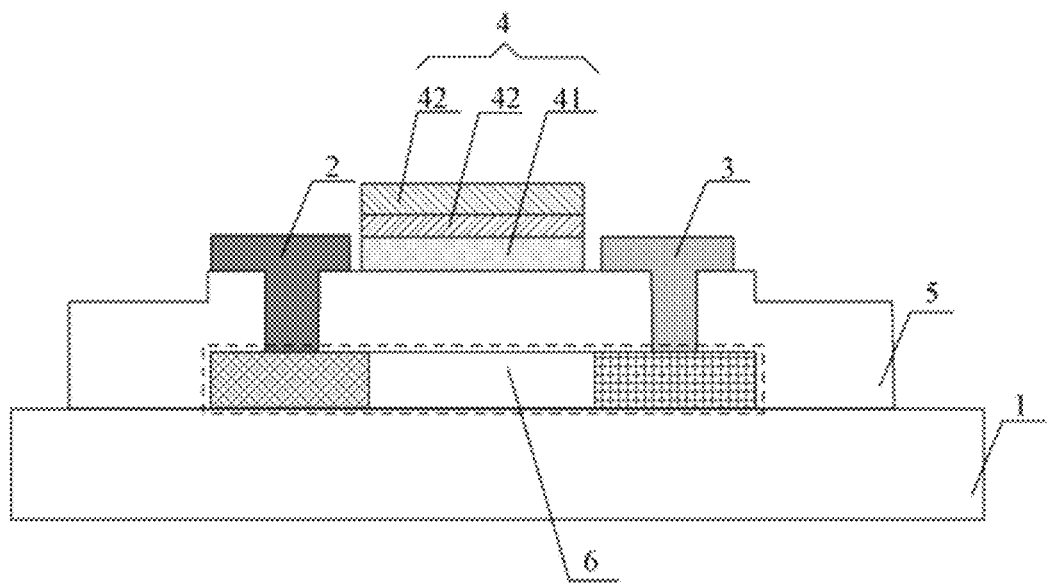
FIG. 2 is a schematic view of a structure of another thin film transistor according to the present disclosure.

Referring to FIG. 2, in a possible thin film transistor according to the present disclosure, the composite metal layer comprises one first metal layer 41 containing doped ions therein and two second metal layers 42 (in the figure, the two second metal layers are distinguished from each other by different filling styles). In an example, a material of the first metal layer 41 comprises molybdenum or titanium, a material of one of the two second metal layer 42 which is located close to the first metal layer 41 comprises aluminum; and, a material of the other of the two second metal layer 42 which is located away from the first metal layer 41 comprises molybdenum or titanium.

In a specific implementation, a ratio of thicknesses between the first metal layer 41 and the two second metal layers 42 may be but is not limited to 2:1:2.

Figure 3:
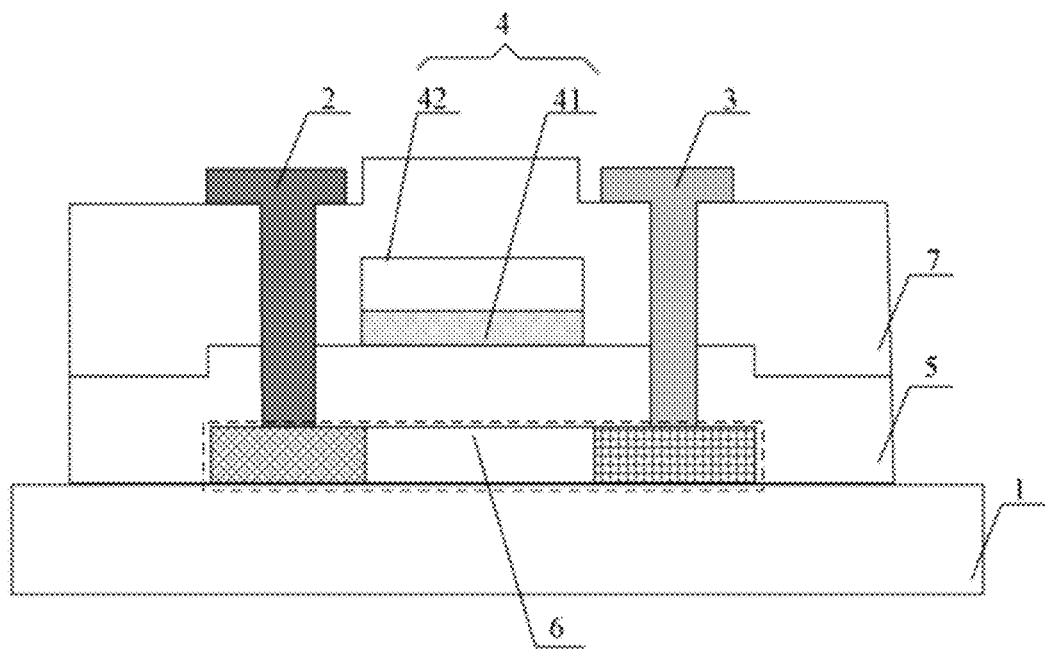
FIG. 3 is a schematic view of a structure of yet another thin film transistor according to the present disclosure.

Referring to FIG. 3, in a specific implementation, optionally, the thin film transistor further comprises an interlayer dielectric layer 7; in an example, the interlayer dielectric layer 7 covers the gate 4 and the gate insulation layer 5, the source electrode 2 passes through the interlayer dielectric layer 7 and the gate insulation layer 5 so as to be connected with the active layer 6, and, the drain electrode 3 passes through the interlayer dielectric layer 7 and the gate insulation layer 5 so as to be connected with the active layer 6.

In this embodiment, the interlayer dielectric layer 7 can provide an insulation function between the gate 4 and the source electrode 2, the drain electrode 3.

Specifically, the material of the interlayer dielectric layer may include but is not limited to silicon oxide or silicon nitride.

Referring to FIG. 4, in a specific implementation, optionally, the thin film transistor further comprises a buffer layer 8 disposed between the active layer 6 and the substrate 1. The gate insulation layer 5 covers the active layer 6 and the buffer layer 8.

In this embodiment, on one hand, the buffer layer 8 can prevent impurity ions in the substrate from diffusing to the active layer 6. On the other hand, defects in the active layer 6 are further reduced due to good interface behavior between the active layer 6 and the buffer layer 8, thereby enhancing mobility of the carriers.

Specifically, a material for the butter layer 8 may include but is not limited to silicon oxide or silicon nitride.

Figure 5:
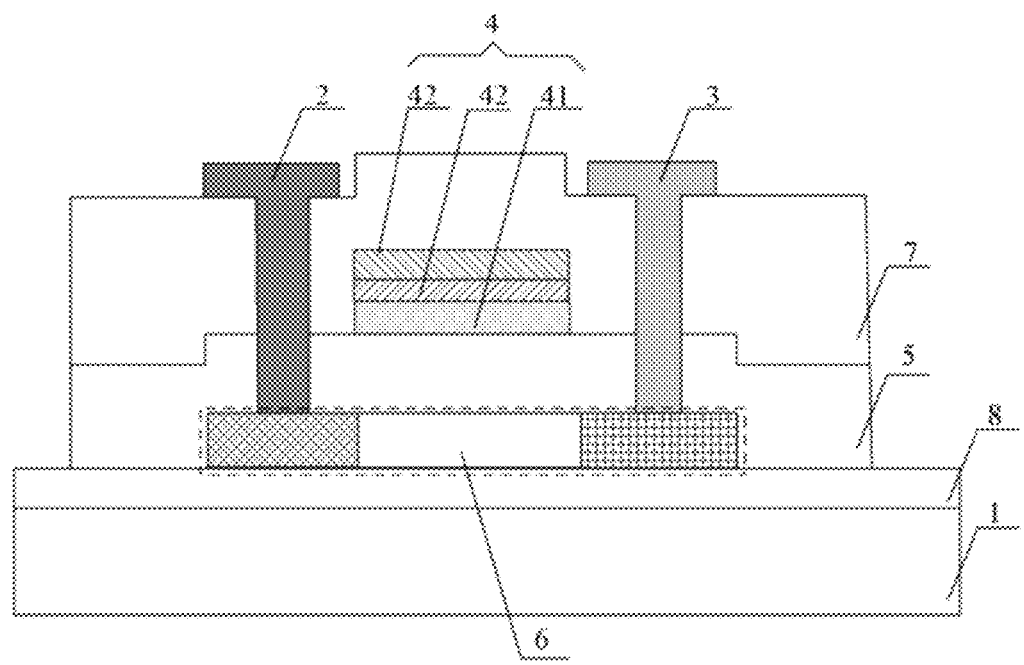
FIG. 5 is a schematic view of a structure of a still further thin film transistor according to the present disclosure.

Optionally, referring to FIG. 5, the composite metal layer comprises one first metal layer 41 containing doped ions therein and two second metal layers 42.

Referring to FIG. 5, for the second stacking sequence where the gate, the gate insulation layer and the active layer are arranged sequentially on the substrate, the gate 4 is located on the substrate 1, the gate insulation layer 5 covers the gate and the substrate 1, and the active layer 6 is located on the gate insulation layer 5.

Figure 6:
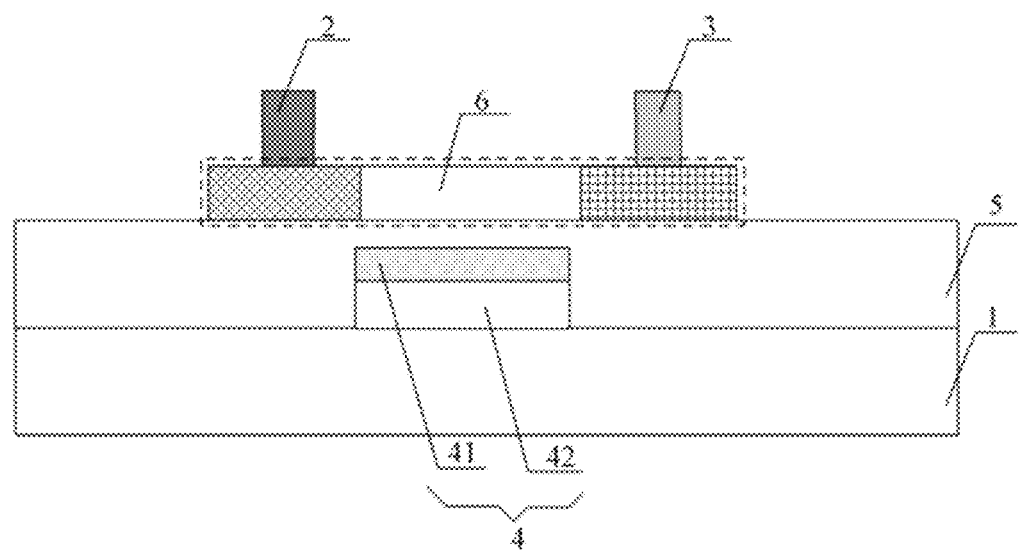
FIG. 6 is a schematic view of a structure of a yet further thin film transistor according to the present disclosure.

Optionally, the thin film transistor shown in FIG. 6 may further comprise a buffer layer disposed between the gate and the substrate.

Optionally, the thin film transistor shown in FIG. 6 may further comprise an interlayer dielectric layer disposed as an uppermost layer with the source electrode and the drain electrode being exposed.

In a specific implementation, specific structure of the gate may refer to those above related embodiments of the present disclosure and will not be described here one by one.

Based on the same concept, the present disclosure also provides a display device comprising the thin film transistor described in any of the above embodiments.

Based on the same concept, the present disclosure also provides a method of manufacturing a thin film transistor, comprising: steps of forming a gate, a gate insulation layer, an active layer, a source electrode and a drain electrode on a substrate; the gate insulation layer is located between the gate and the active layer; the source electrode and the drain electrode are connected to the active layer, respectively; the step of forming the gate comprises: forming a composite metal layer for formation of the gate; the composite metal layer comprises at least one first metal layer which contains doped ions therein and which is located close to the gate insulation layer, and at least one second metal layer which is located away from the gate insulation layer. Specifically, the first metal layer containing doped ions therein is configured to introduce a stress to the active layer. In addition, specifically, the composite metal layer is formed to obtain the gate by using an ion implantation process and a patterning process.

In the thin film transistor according to embodiments of the present disclosure, the gate is in a structure of a composite metal layer. Specifically, a first metal layer of the composite metal layer located close to the gate insulation layer contains doped ions therein. This can introduce a stress to the active layer, change energy band structure of the channel region in the active layer, and alter effective quality and anisotropic scattering of carriers, and the like, thereby enhancing mobility of carriers. In addition, a second metal layer of the composite metal layer located away from the gate insulation layer is not doped with ions, so that effective resistance of the whole gate is ensured. In embodiments of the present disclosure, enhancement or improvement of mobility of carriers is achieved by modifying the gate of the thin film transistor. Meanwhile, no additional structure is required to be added, which simplifies the processes in the course of production.

Specifically, for formation of the gate, the composite metal layer is formed using an ion implantation process and a patterning process. More specifically, one first metal thin film is formed; then ion injection or implantation is implemented to the first metal thin film; then, at least one second metal thin film is formed on the first metal thin film into which the nitrogen ions have been injected; whereafter, the first metal thin film and the second metal thin film are etched by using a patterning process, to form the gate.

As to the first stacking sequence where the active layer, the gate insulation layer and the gate are arranged sequentially on the substrate, a method of manufacturing a thin film transistor will be described in detail by taking the thin film transistor shown in FIG. 1 as an example.

Figure 7:
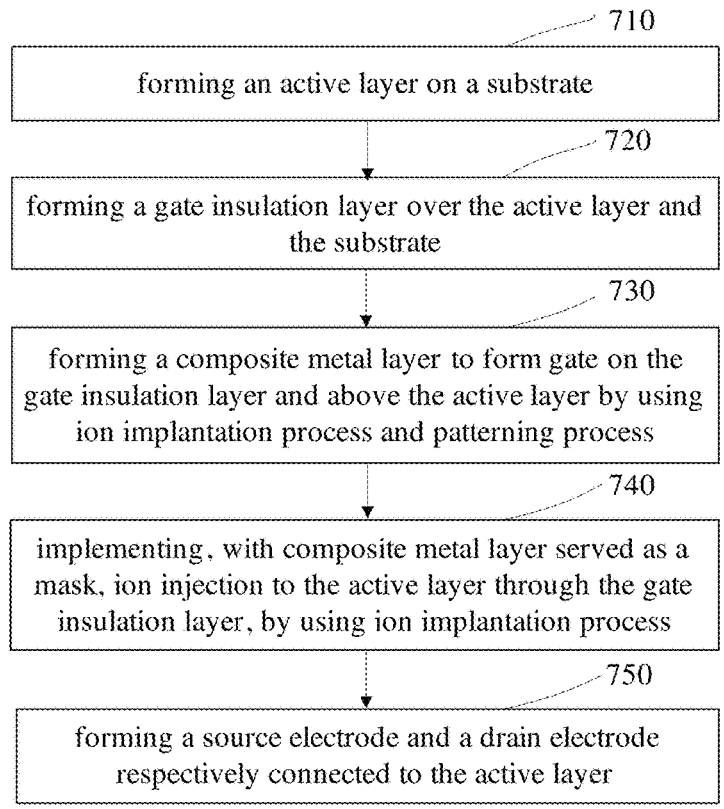
FIG. 7 is a flow diagram of a method of manufacturing a thin film transistor according to the present disclosure.

Optionally, referring to FIG. 7, the steps of forming the gate, the gate insulation layer, the active layer, the source electrode and the drain electrode on the substrate, at least comprises the following steps.

Figure 8A:
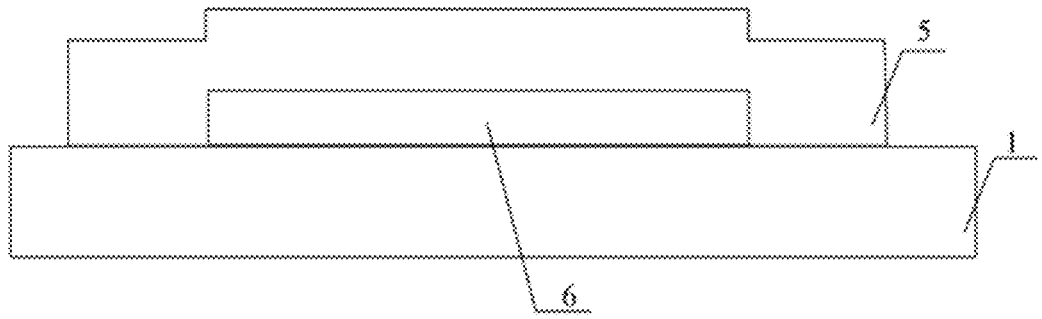
FIG. 8a to FIG. 8c are schematic views of structures of a thin film transistor according to the present disclosure obtained during its manufacture process.

In step 710, the active layer 6 is formed on the substrate, as shown in FIG. 8a.

Specifically, amorphous silicon is deposited on the substrate, and is crystallized and patterned to form the active layer. Exemplary, manner of crystallization of the polysilicon includes processes such as excimer laser annealing, or the like.

In step 720, the gate insulation layer 5 is formed over the active layer 6 and the substrate 1, as shown in FIG. 8a.

Exemplarily, the gate insulation layer is a composite thin film of silicon oxide and silicon nitride.

Figure 8B:
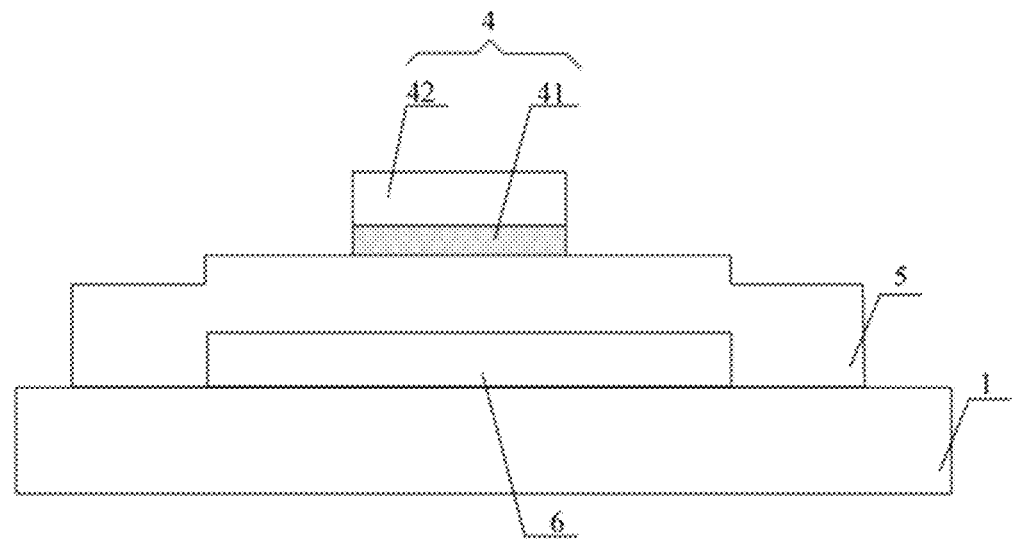

In step 730, the composite metal layer is formed to form or obtain the gate 4 on the gate insulation layer 5 and above the active layer 6 by using an ion implantation process and a patterning process, as shown in FIG. 8b.

Figure 8C:
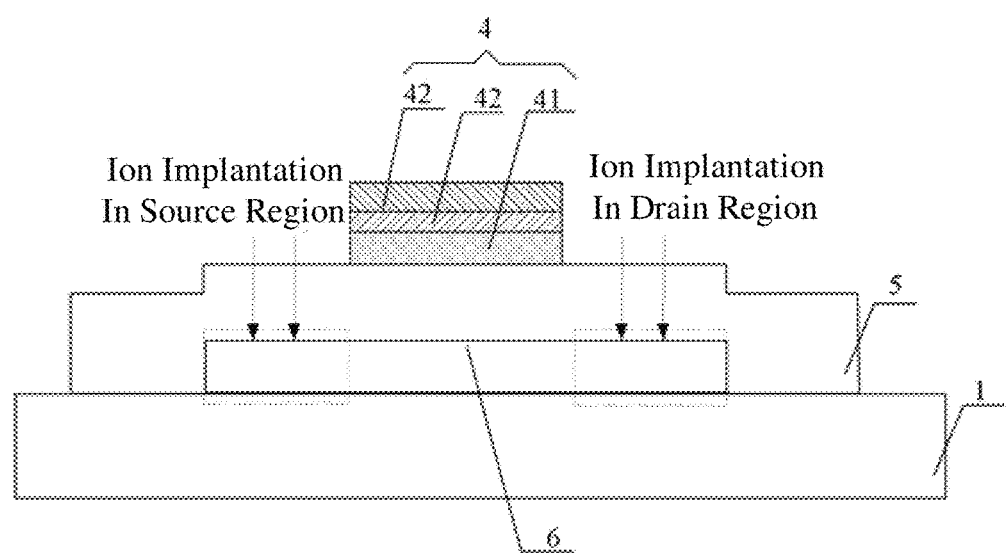

In step 740, with the composite metal layer being served as a mask, an ion injection or implantation is implemented to the active layer 6 through the gate insulation layer 5, by using an ion implantation process, as shown in FIG. 8c.

This step is mainly used for forming the source region and the drain region in the active layer. In addition, in this step, the injected ions may be boron ions or phosphorus ions.

In step 750, the source electrode and the drain electrode are formed to be respectively connected to the active layer.

Figure 9A:
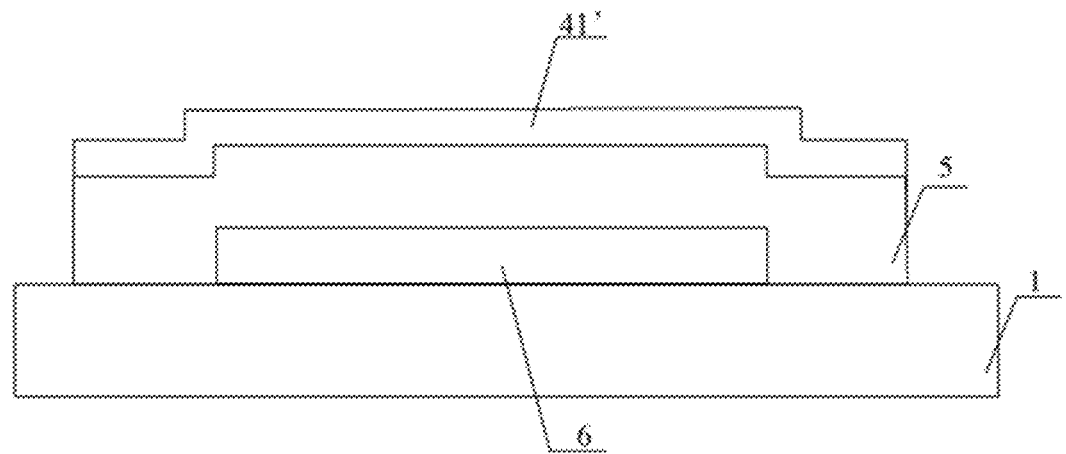
FIG. 9a to FIG. 9d are schematic views of structures of a gate of a thin film transistor according to the present disclosure obtained during its manufacture process.
Figure 9B:
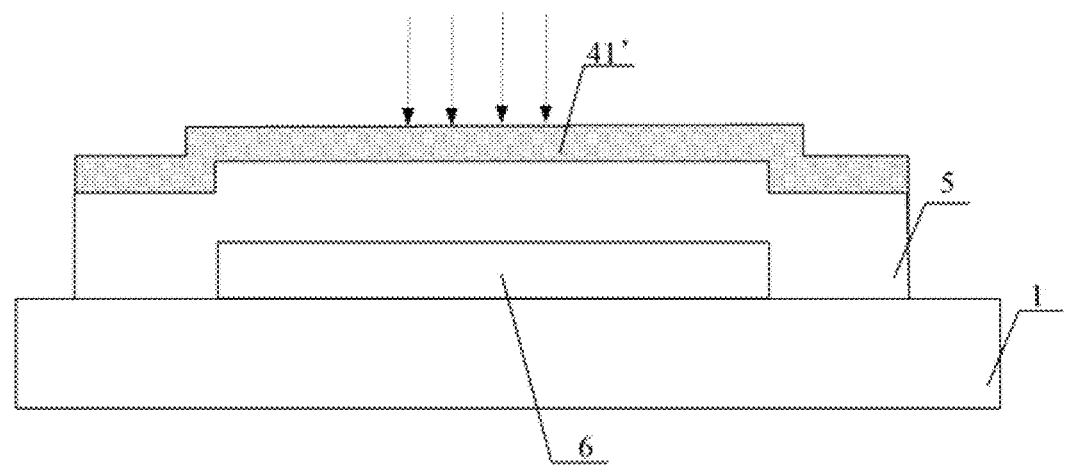
Figure 9C:
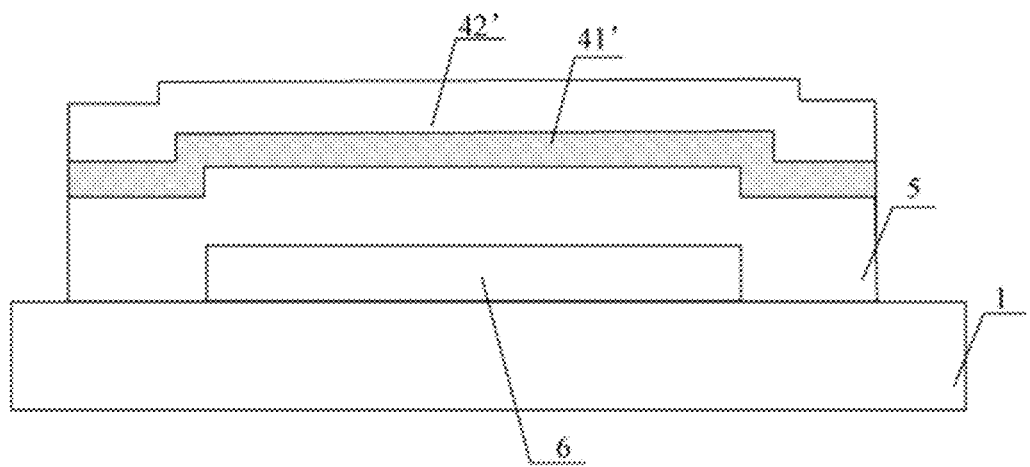
Figure 9D:
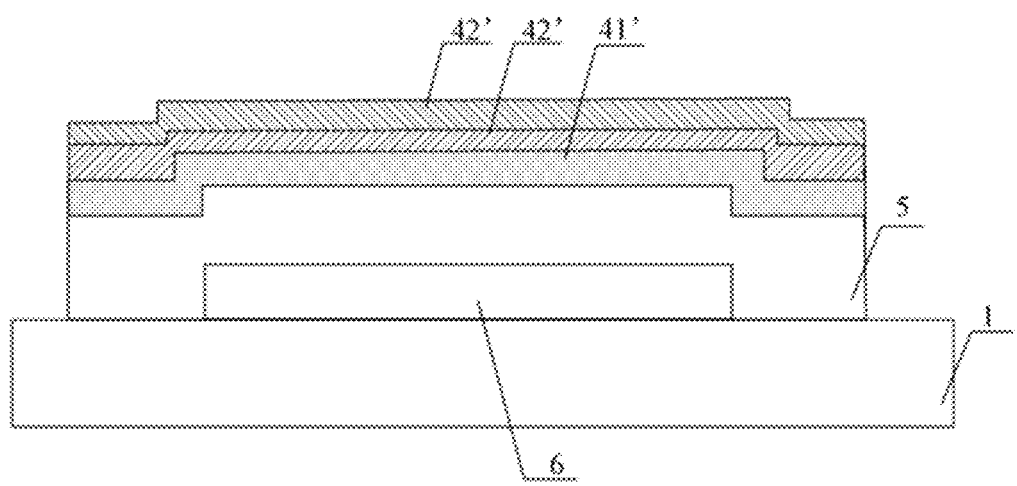

In a specific implementation, optionally, the step of forming the composite metal layer to form or obtain the gate 4 on the gate insulation layer and above the active layer 6 by using the ion implantation process and the patterning process, at least comprises the following sub-steps: a first sub-step of, as shown in FIG. 9a, forming at least one first metal thin film 41' on the gate insulation layer 5 and above the active layer 6; a second sub-step of, as shown in FIG. 9b, implementing an ion injection or implantation to the first metal thin film 41'; exemplarily, the injected ions may be nitrogen ions; a third sub-step of, as shown in FIG. 9c, forming at least one second metal thin film 42' on the first metal thin film 41' into which the nitrogen ions have been injected; in this sub-step, two second metal thin films 42' may be formed (as shown in FIG. 9d); and a fourth sub-step of etching the first metal thin film 41' and the second metal thin film 42' by using a patterning process, to form the gate 4.

Optionally, in a specific implementation, when the first metal thin film 41' is injected with nitrogen ions, energy value of the nitrogen ions is in a range of 20 kev~40 kev.

Figure 10:
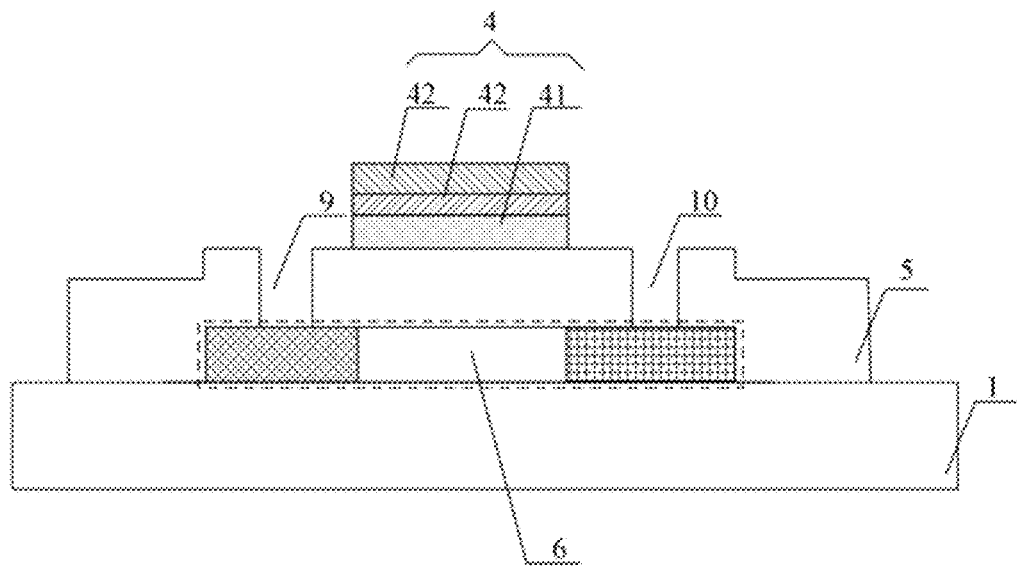
FIG. 10 is a schematic view of structures of a source electrode and a drain electrode of a thin film transistor according to the present disclosure obtained during its manufacture process.

In a specific implementation, optionally, the step of forming the source electrode 2 and the drain electrode 3 respectively connected to the active layer 6, comprises the following sub-steps: a first sub-step of, as shown in FIG. 10, forming a first contact hole 9 and a second contact hole 10, which pass through the gate insulation layer, by a patterning process, to expose the active layer 6; and a second sub-step of, as shown in FIG. 10, depositing a source electrode metal layer and a drain electrode metal layer into the first contact hole 9 and the second contact hole 10, respectively, to form the source electrode 2 and the drain electrode 3.

Figure 11:
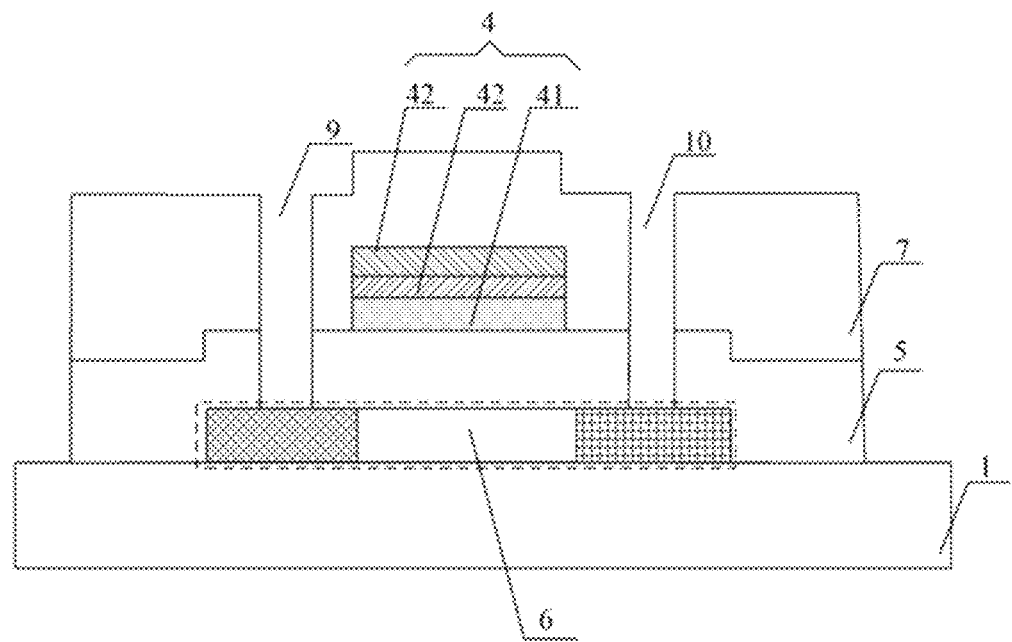
FIG. 11 is a schematic view of structures of a source electrode and a drain electrode of another thin film transistor according to the present disclosure obtained during its manufacture process

In a specific implementation, optionally, the above method further comprises forming an interlayer dielectric layer 7 which covers the gate 4 and the gate insulation layer 5; and, the step of forming the source electrode 2 and the drain electrode 3 respectively connected to the active layer 6 comprises the following sub-steps: a first sub-step of, as shown in FIG. 11, forming a first contact hole 9 and a second contact hole 10, which pass through the interlayer dielectric layer 7 and the gate insulation layer 5, by a patterning process, to expose the active layer 6; and, a second sub-step of depositing a source electrode metal layer and a drain electrode metal layer into the first contact hole 9 and the second contact hole 10, respectively, to form the source electrode 2 and the drain electrode 3.

Specifically, the interlayer dielectric layer 7 is a composite thin film of silicon oxide and silicon nitride.

In a specific implementation, optionally, before forming the active layer 6 on the substrate 1, the above method further comprises: forming a buffer layer 8 on the substrate 1. Specifically, the buffer layer 8 is a composite thin film of silicon oxide and silicon nitride.

In a specific implementation, the buffer layer, the amorphous silicon layer and the gate insulation layer may be all deposited using Plasma Enhanced Chemical Vapor Deposition (PECVD).

As to the second stacking sequence where the gate, the gate insulation layer and the active layer are arranged sequentially on the substrate, specific manufacturing steps of a method of manufacturing a thin film transistor may refer to the above related embodiments of the present disclosure and will not be repeatedly described here one by one. In addition, specific manufacturing steps for the active layer, the gate insulation layer, the source electrode, the drain electrode and the buffer layer, etc. may refer to those in prior art. Moreover, sequence of specific manufacturing steps for the gate, the active layer, the gate insulation layer, the source electrode, the drain electrode and the buffer layer, etc. may also refer to those in prior art and will not be described here.

A thin film transistor and a method of manufacturing the same, and a display device including the above thin film transistor are provided in the embodiments of the present disclosure. In the above thin film transistor, the gate is configured as a composite metal layer. Specifically, a first metal layer of the composite metal layer located close to the gate insulation layer contains doped ions therein. This can introduce a stress to the active layer, change energy band structure of the channel region in the active layer, and alter effective quality and anisotropic scattering of carriers, and the like, thereby enhancing or improving mobility of carriers. In addition, a second metal layer of the composite metal layer located apart from the gate insulation layer is not doped with ions, so that effective resistance of the whole gate is ensured. In the embodiments of the present disclosure, enhancement or improvement of mobility of the carriers is achieved by modifying the gate of the thin film transistor. Meanwhile, no additional structure is required to be added, which simplifies the processes in the course of production.

Although exemplary embodiments of the present disclosure have been shown and described, those skilled in the art may make other changes and modifications on these embodiments when they have learned the general inventive concept. Accordingly, the attached claims intend to be interpreted to include these exemplary embodiments and all the changes and modifications falling into the scope of the present disclosure.

Obviously, those skilled in the art may make various changes and modifications on the present disclosure without departing from the principles and spirit of the disclosure. As a result, the present disclosure intends to include these changes and modifications if they fall into the scope of the claims and their equivalents.

What is claimed is:

1. A thin film transistor comprising: a substrate, and, a source electrode, a drain electrode, a gate, a gate insulation layer and an active layer disposed on the substrate;
   wherein the gate insulation layer is between the gate and the active layer, and the source electrode and the drain electrode are connected to the active layer, respectively; and
   wherein the gate is a composite metal layer comprising:
      at least one first metal layer which contains doped ions therein and which is close to the gate insulation layer; and
      two second metal layers which are apart from the gate insulation layer and are not doped with ions,
      wherein, a material of the first metal layer comprises molybdenum or titanium,
      a material of one said second metal layer which is close to the first metal layer comprises aluminum, and
      a material of one said second metal layer which is apart from the first metal layer comprises molybdenum or titanium.

2. The thin film transistor of claim 1, wherein, the first metal layer which contains doped ions therein is configured to introduce a stress to the active layer.

3. The thin film transistor of claim 2, wherein, in the first metal layer which contains doped ions therein, the doped ions comprise nitrogen ions.

4. The thin film transistor of claim 3, wherein, a dosage of the nitrogen ions in the first metal layer is in a range of $1.0e^{12}/cm^2 \sim 1.0e^{13}/cm^2$.

5. The thin film transistor of claim 3, wherein, a material of the gate insulation layer at least comprises silicon oxide or silicon nitride.

6. The thin film transistor of claim 2, wherein a stacking sequence of the gate, the active layer and the gate insulation layer on the substrate is an arrangement of the active layer, the gate insulation layer and the gate in this order.

7. The thin film transistor of claim 2, wherein, a stacking sequence of the gate, the active layer and the gate insulation layer on the substrate is an arrangement of the gate, the gate insulation layer and the active layer in this order.

8. The thin film transistor of claim 1, wherein, a stacking sequence of the gate, the active layer and the gate insulation layer on the substrate is an arrangement of the active layer, the gate insulation layer and the gate in this order.

9. The thin film transistor of claim 8, further comprising an interlayer dielectric layer, wherein, the interlayer dielectric layer covers the gate and the gate insulation layer, the source electrode passes through the interlayer dielectric layer and the gate insulation layer to be connected with the active layer, and, the drain electrode passes through the interlayer dielectric layer and the gate insulation layer to be connected with the active layer.

10. The thin film transistor of claim 1, wherein, a stacking sequence of the gate, the active layer and the gate insulation layer on the substrate is an arrangement of the gate, the gate insulation layer and the active layer in this order.

11. A display device, comprising the thin film transistor of claim 1.

12. A method of manufacturing a thin film transistor, the method comprising steps of forming a gate, a gate insulation layer, an active layer, a source electrode and a drain electrode on a substrate;
    wherein the gate insulation layer is between the gate and the active layer, and the source electrode and the drain electrode are connected to the active layer, respectively; and
    wherein the step of forming the gate comprises:
       forming a composite metal layer for formation of the gate, wherein the composite metal layer comprises:
          at least one first metal layer which contains doped ions therein and which is close to the gate insulation layer; and
          two second metal layers which are apart from the gate insulation layer and are not doped with ions,
          wherein, a material of the first metal layer comprises molybdenum or titanium,
          a material of one said second metal layer which is close to the first metal layer comprises aluminum, and
          a material of one said second metal layer which is apart from the first metal layer comprises molybdenum or titanium.

13. The method of claim 12, wherein, the first metal layer which contains doped ions therein is configured to introduce a stress to the active layer.

14. The method of claim 13, wherein, the steps of forming the gate, the gate insulation layer, the active layer, the source electrode and the drain electrode on the substrate comprise:
    forming the active layer on the substrate;

forming the gate insulation layer over the active layer and the substrate;

forming the composite metal layer to form the gate on the gate insulation layer and above the active layer by using an ion implantation process and a patterning process;

implementing, with the composite metal layer served as a mask, an ion injection to the active layer through the gate insulation layer, by using an ion implantation process; and forming the source electrode and the drain electrode respectively connected to the active layer.

15. The method of claim 14, wherein, the forming the composite metal layer to form the gate on the gate insulation layer and above the active layer by using the ion implantation process and the patterning process, comprises:

forming at least one first metal thin film on the gate insulation layer and above the active layer;

implementing nitrogen ion injection to the first metal thin film;

forming at least one second metal thin film on the first metal thin film into which the nitrogen ions were injected; and etching the first metal thin film and the second metal thin film by using a patterning process, so as to form the gate.

16. The method of claim 15, wherein, when implementing nitrogen ion injection to the first metal thin film, an energy value of the nitrogen ions is in a range of 20 kev~40 kev.

17. The method of claim 14, further comprising: forming an interlayer dielectric layer which covers the gate and the gate insulation layer; and the forming the source electrode and the drain electrode respectively connected to the active layer comprises:

forming a first contact hole and a second contact hole which pass through the interlayer dielectric layer and the gate insulation layer, by a patterning process, to expose the active layer; and depositing a source electrode metal layer and a drain electrode metal layer into the first contact hole and the second contact hole, respectively, to form the source electrode and the drain electrode.

18. The method of claim 12, wherein, the composite metal layer is formed so as to form the gate by using an ion implantation process and a patterning process.

* * * * *